United States Patent
Bottomfield et al.

(10) Patent No.: US 12,313,290 B2
(45) Date of Patent: May 27, 2025

(54) SEMICONDUCTOR TURBINE RESET

(71) Applicant: Texas Capitol Semiconductor, Inc., Chandler, AZ (US)

(72) Inventors: Roger L. Bottomfield, Chandler, AZ (US); Andrew Lei, Mesa, AZ (US)

(73) Assignee: Texas Capitol Semiconductor, Inc., Chandler, AZ (US)

( * ) Notice: Subject to any disclaimer, the term of this patent is extended or adjusted under 35 U.S.C. 154(b) by 0 days.

(21) Appl. No.: 18/187,559

(22) Filed: Mar. 21, 2023

(65) Prior Publication Data

US 2023/0221015 A1     Jul. 13, 2023

Related U.S. Application Data

(63) Continuation of application No. 16/549,209, filed on Aug. 23, 2019, now Pat. No. 11,635,216.

(Continued)

(51) Int. Cl.
| | |
|---|---|
| *F24F 3/167* | (2021.01) |
| *F24F 8/117* | (2021.01) |
| *F24F 11/58* | (2018.01) |
| *G05B 15/02* | (2006.01) |
| *G05B 19/042* | (2006.01) |

(Continued)

(52) U.S. Cl.
CPC .............. *F24F 3/167* (2021.01); *F24F 11/58* (2018.01); *G05B 15/02* (2013.01); *G05B 19/042* (2013.01); *G05B 19/41855* (2013.01); *H01L 21/67017* (2013.01); *H01L 21/67155* (2013.01); *F24F 8/117* (2021.01); *G05B 2219/45031* (2013.01)

(58) Field of Classification Search
CPC ........... F24F 3/167; G05B 2219/45031; G05B 15/02; G05B 19/042; G05B 19/41855; G05B 19/0425
See application file for complete search history.

(56) References Cited

U.S. PATENT DOCUMENTS

| 2005/0049834 A1* | 3/2005 | Bottomfield ....... G05B 23/0229 |
| | | 702/183 |
| 2007/0227448 A1 | 10/2007 | Tomine |

(Continued)

FOREIGN PATENT DOCUMENTS

JP     2008251050 A   *   10/2008

OTHER PUBLICATIONS

JP2008251050A Translation (Year: 2008).*

*Primary Examiner* — Schyler S Sanks
(74) *Attorney, Agent, or Firm* — Brian M. Kaufman; Robert D. Atkins; PATENT LAW GROUP: Atkins and Associates, P.C.

(57) ABSTRACT

A semiconductor manufacturing system has a turbine disposed inside a semiconductor manufacturing clean room. A controller is disposed outside the semiconductor manufacturing clean room and is coupled to the turbine through a first cable. A first computer is coupled to the controller through a second cable. The first computer has a web server configured to communicate with the controller via the second cable. A second computer is disposed in the semiconductor manufacturing clean room and is connected to the web server of the first computer. The web server hosts a web page including a reset button configured to issue a reset command to the controller. The web page also displays a status of the turbine.

20 Claims, 3 Drawing Sheets

Related U.S. Application Data

(60) Provisional application No. 62/722,051, filed on Aug. 23, 2018.

(51) Int. Cl.
*G05B 19/418* (2006.01)
*H01L 21/67* (2006.01)

(56) References Cited

U.S. PATENT DOCUMENTS

| | | | |
|---|---|---|---|
| 2010/0289653 A1* | 11/2010 | Calio | G01N 1/24 |
| | | | 340/606 |
| 2015/0268139 A1 | 9/2015 | Calio, Jr. et al. | |
| 2018/0231946 A1* | 8/2018 | Savo | G05B 19/4185 |

* cited by examiner

SEMICONDUCTOR TURBINE RESET

CLAIM OF DOMESTIC PRIORITY

The present application is a continuation of U.S. patent application Ser. No. 16/549,209, now U.S. Pat. No. 11,635,216, filed Aug. 23, 2019, which claims the benefit of U.S. Provisional Application No. 62/722,051, filed Aug. 23, 2018, which applications are incorporated herein by reference.

FIELD OF THE INVENTION

The present invention relates in general to semiconductor manufacturing and, more particularly, to a reset feature for turbines and turbine controllers in semiconductor manufacturing equipment.

BACKGROUND OF THE INVENTION

Semiconductor manufacturing and processing equipment commonly uses turbines to create a vacuum. A vacuum may be required for various processing steps of a semiconductor wafer, such as extreme ultraviolet (EUV) lithography, thin film deposition, etching, or ion implantation. The vacuum allows the process to apply molecules or an electron beam to the semiconductor wafer without interference from air molecules.

Semiconductor equipment that uses a vacuum for wafer processing commonly generates the vacuum using a turbomolecular pump. FIG. 1 illustrates an example semiconductor manufacturing facility 10 with semiconductor equipment 12, e.g., a chemical vapor deposition machine. Semiconductor equipment 12 includes a turbomolecular pump 14 for creating a vacuum within the equipment. Facility 10 illustrates a common setup for semiconductor manufacturing facilities. The wafer processing equipment is located in a clean room 20, with various support equipment located in adjacent rooms. Keeping equipment outside clean room 20 to the extent possible helps maintain cleanliness of the clean room.

Many facilities have controller 50 for turbomolecular pump 14 located two stories below equipment 12, as illustrated in FIG. 1. Semiconductor equipment 12 is in clean room 20 on the top level of facility 10, while controller 50 for the turbine is on level 30, two stories below. Second level 40 is between clean room 20 and level 30 and houses cabling and additional support equipment for the clean room.

Controller 50 includes a control cable 52 wired from level 30 to clean room 20 to operate turbomolecular pump 14. Control cable 52 has one end connected to a port on controller 50, and a second end connected to a corresponding port on turbomolecular pump 14 or semiconductor equipment 12. Generally, some type of DIN port is used, but the port and cable can be any suitable form factor, e.g., Ethernet, HDMI, or Universal Serial Bus (USB). Controller 50 includes physical buttons on the front of the controller to operate turbomolecular pump 14, e.g., start button 54 and stop button 56 to start and stop the turbomolecular pump. In other embodiments, controller 50 includes a display and buttons used to navigate an interface on the display.

Turbomolecular pump 14 can rotate at between 20,000 and 90,000 revolutions per minute (RPM), so ensuring no unsafe conditions exist is important. Turbomolecular pump 14 includes a variety of sensors and other mechanisms to confirm proper operation of the turbomolecular pump. If any fail-safe sensors are tripped during operation, controller 50 can shut down turbomolecular pump 14 and indicate an error by turning on an LED error indicator 58. In some embodiments, information regarding the error can be shown on the display of controller 50.

To turn turbomolecular pump 14 back on after an error condition, a user of semiconductor equipment 12 must leave clean room 20 and climb down two flights of stairs 70 to press reset button 60, thus clearing the error condition and restarting the turbomolecular pump. However, for a user operating equipment 12, leaving clean room 20 can be highly inconvenient. Clean rooms commonly have staging rooms where a clean suit must be taken off when leaving and put on when entering. Donning the clean suit can require a multiple-step protocol and can occupy considerable time.

Between the clean room protocol, and having to travel down two flights of stairs, clearing an error of turbomolecular pump 14 on controller 50 can be a significant impact on productivity of facility 10. Therefore, a need exists for a method of resetting turbomolecular pump 14 errors without leaving clean room 20.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
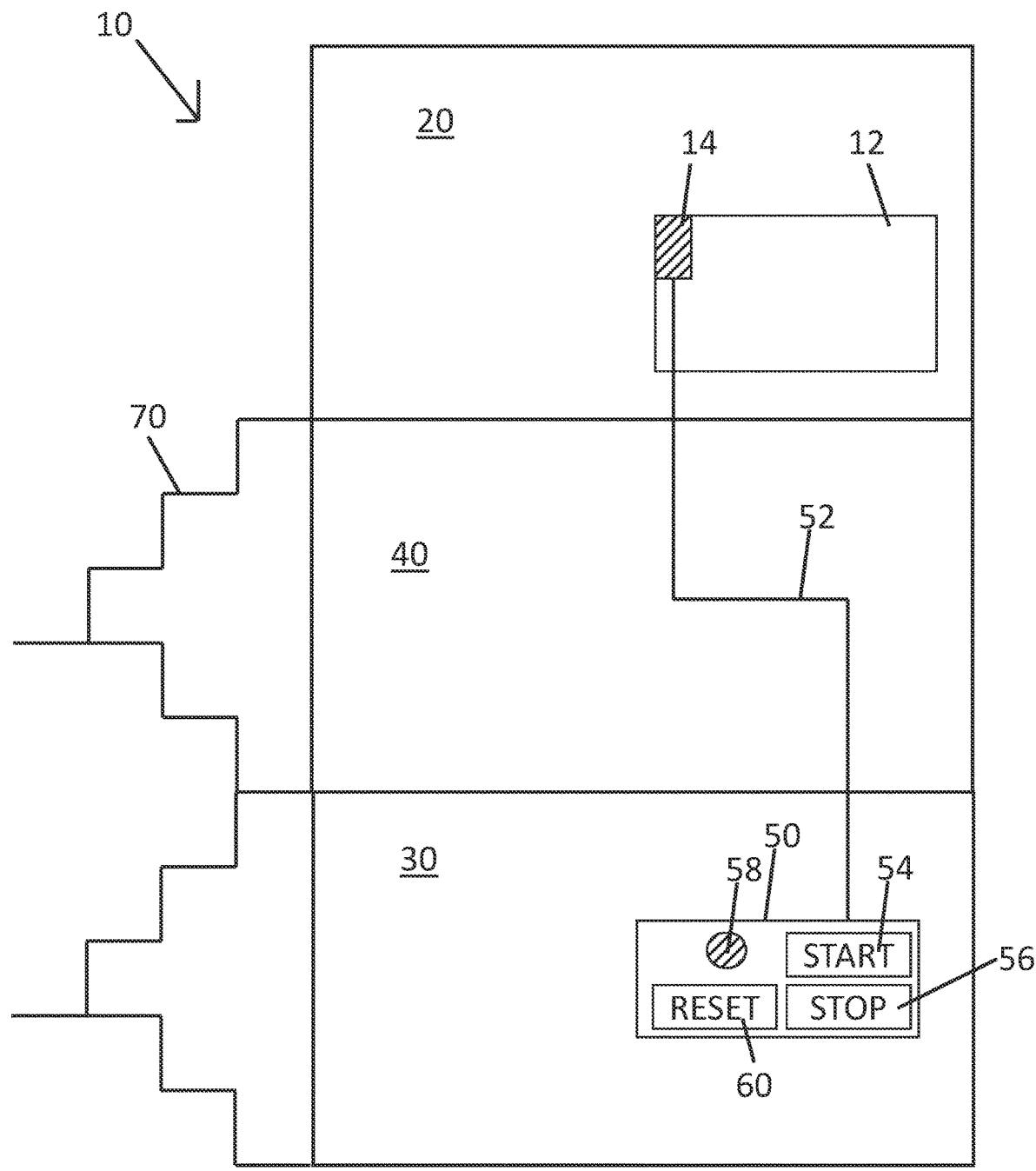
FIG. 1 illustrates a semiconductor manufacturing facility with a clean room and a turbine controller outside the clean room.
Figure 2:
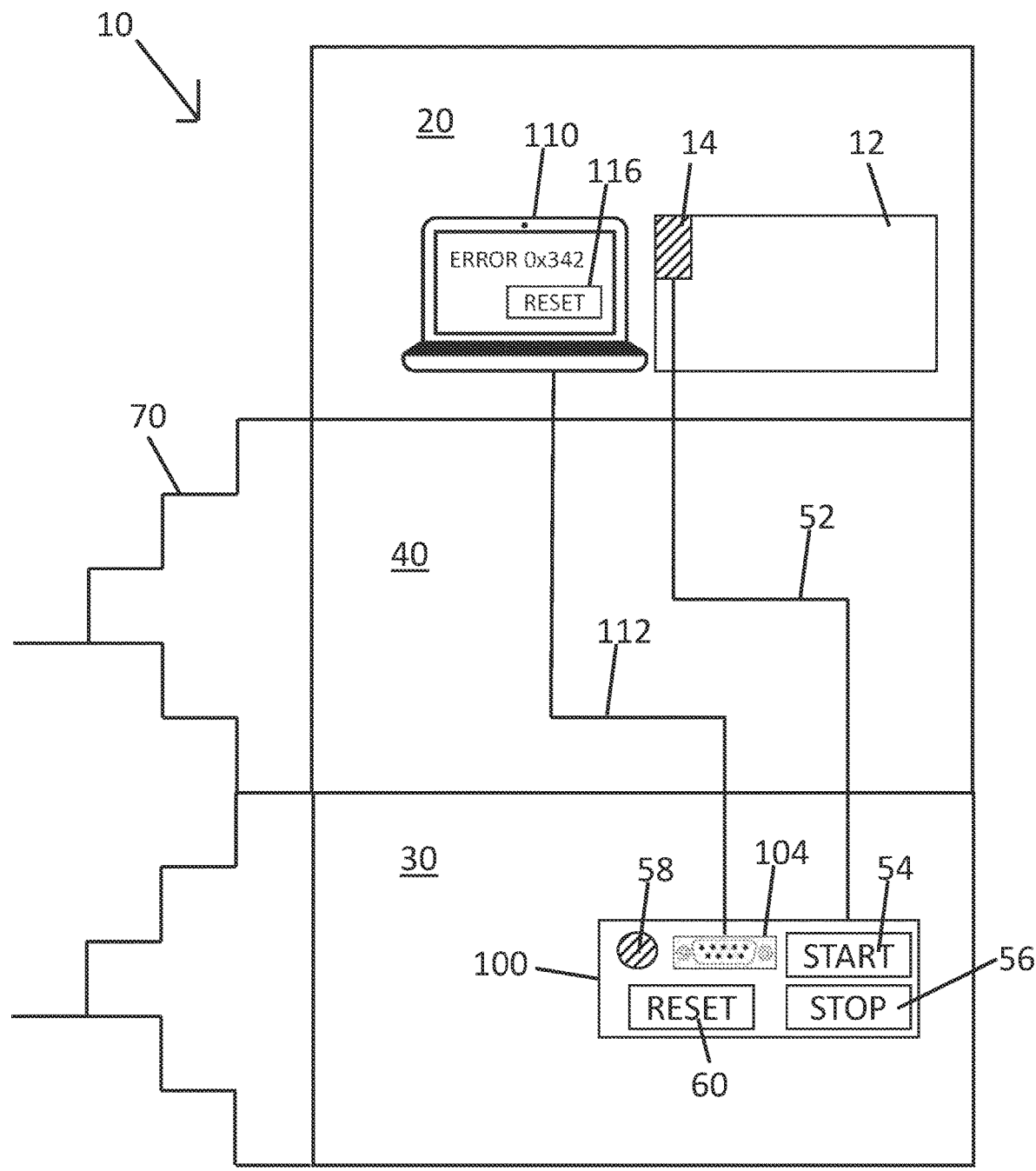
FIG. 2 illustrates a turbine controller with a computer in the clean room connected to the turbine controller.

Some controllers for turbomolecular pumps include diagnostic ports, such as controller 100 with serial port 104 in FIG. 2. Serial port 104 allows another computer to connect to controller 100 and communicate with the controller at a low level using the RS-232 protocol. In other embodiments, other ports and protocols are used to communicate with controller 100, e.g., a JTAG, Ethernet, or USB port. In FIG. 2, laptop 110 is located within clean room 20 and connected to serial port 104 through a serial cable 112. In some embodiments, laptop 110 includes a built-in serial port compatible with serial cable 112 and serial port 104. In other embodiments, a USB to RS-232 or another adapter is used. Laptop 110 can be a personal computer, tablet computer, single-board computer, or any other suitable device capable of communicating with serial port 104.

Laptop 110 is running software that communicates with controller 100 via serial port 104. Controller 100 includes a set of commands that can be issued by laptop 110 and received by the controller through serial port 104. Controller 100 can then issue a response via serial port 104 to the computer acknowledging completion of the command or returning requested information. The commands can be used to read various values of sensors within turbomolecular pump 14, e.g., revolutions per minute of the turbine, intake or output air pressure, electrical current draw, etc. The software running on laptop 110 periodically polls various sensor values of note and displays the sensor values on laptop 110 while turbomolecular pump 14 is running. Controller 100 is also able to output information to laptop 110 without being polled.

Laptop 110 gives a user of semiconductor equipment 12 useful insight into the status of turbomolecular pump 14. In addition to reading the values of various sensors of turbomolecular pump 14, laptop 110 is capable of determining through serial port 104 whether an error condition exists for the turbomolecular pump. The software on laptop 110 displays error information to the user when an error occurs. In FIG. 2, the error code is 0x342. The user can use that code to look up what error occurred, and what steps might be required to remedy the problem. In other embodiments, the software on laptop 110 is capable of decoding the error and displays information about what problem occurs and possible solutions.

When an error does occur, the user can see what the problem is on laptop 110 and rectify any issues with turbomolecular pump 14 that may have caused the error without leaving clean room 20. Laptop 110 includes a mechanism for issuing a reset command to controller 100 through serial port 104 so the turbomolecular pump can be totally restarted after an error occurs without leaving clean room 20. FIG. 2 shows reset button 116 displayed on laptop 110 that the user can click with a mouse pointer or press with a finger on a touchscreen. Pressing reset button 116 on laptop 110 issues a command to controller 100, via serial port 104 to clear the error and start turbomolecular pump 14 back up.

In some embodiments, controller 100 is designed by the manufacturer of the controller to operate within one of a plurality of predefined modes of operation. Under normal operation, controller 100 is in full control of turbomolecular pump 14, and the device connected to serial port 104 is in a read-only mode. Laptop 110 can read out sensor values and other information from controller 100 but is not capable of issuing commands to operate turbomolecular pump 14. In order to issue the reset command, the software on laptop 110 first issues a command to take control of turbomolecular pump 14 from controller 100. Controller 100 then enters an external control mode wherein the controller's internal software no longer controls turbomolecular pump 14, and the device connected to serial port 104 has exclusive control over the turbomolecular pump. In external control mode, laptop 110 has control over turbomolecular pump 14 and is capable of issuing the reset command, as well as other commands, to the turbomolecular pump. After the reset command is issued, computer 110 can issue another command to leave the external control mode and enter the read-only mode, thus returning control back to controller 100.

Laptop 110 in clean room 20 allows a user of semiconductor equipment 12 to diagnose and clear errors of turbomolecular pump 14 without leaving clean room 20. Laptop 110 reduces the amount of time wasted by turbomolecular pump errors significantly by not requiring the user to exit and enter clean room 20 each time an error occurs. In addition, much of the equipment uses electrodes with very high voltage or energy levels, e.g., implant machines. Shutting down the equipment and leaving the room requires discharging the high energy electrodes and then recharging after entering, which takes significant time. Connecting to controller 100 from within clean room 20 saves a lot of time by allowing turbine 14 to be reset without turning off the manufacturing equipment.

Figure 3:
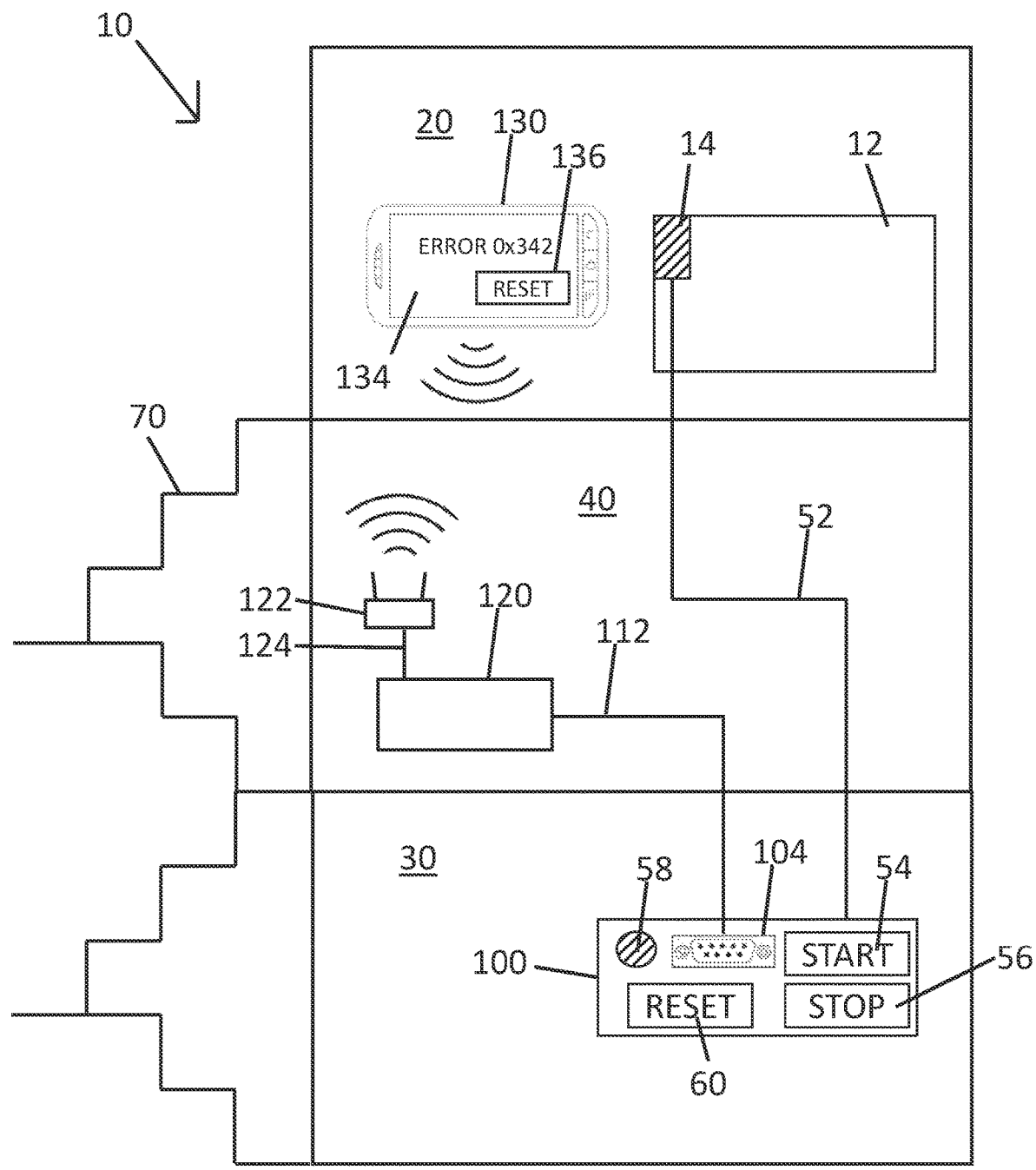
FIG. 3 illustrates a server outside the clean room connected to the turbine controller, and a client device in the clean room connected to the server.

FIG. 3 illustrates another embodiment with a server 120 coupled to serial port 104. Server 120 is located in level 40, outside of clean room 20. Server 120 could also be located in level 30 with controller 100, in clean room 20, or any other convenient location. Having server 120 outside of clean room 20 helps reduce clutter in the clean room and reduces the cables that must be run into the clean room.

Server 120 includes a serial port that is coupled to serial port 104 through serial cable 112. Unlike laptop 110, server 120 is a headless server that is not operated by a user directly manipulating a mouse and keyboard or other input device at the server's location. Rather, server 120 is running web server software connected to the local network that can be accessed by any other computer on the same network. FIG. 3 shows server 120 coupled to a Wi-Fi router or access point 122 through Ethernet cable 124. Router 122 allows other devices connected through a wired or wireless connection to access server 120.

In FIG. 3, a tablet computer 130 in clean room 20 includes a Wi-Fi connection to router 122. Tablet 130 is on the same network as server 120, and is able to access the functionality of software running on the server through the network. In some embodiments, server 120 operates as a traditional web server, where a uniform resource locator (URL) or internet protocol (IP) address is typed into a web browser on tablet 130 to view web page 134 hosted by the server.

Web page 134 provided from server 120 includes various user interface elements to display sensor information, error information, and allow reset of turbomolecular pump 14 via reset button 136. Server 120 reads sensor values from controller 100 through serial port 104, and then generates web page 134 using various web standards such as HTML, JavaScript, CSS, etc. Web page 134, including data read by server 120 from controller 100, is displayed on tablet 130. In some embodiment, a protocol such as Ajax is used to provide live updates of data on web page 134 without refreshing.

When a reset, or another control command, to turbomolecular pump 14 is desired, a user presses or clicks a user interface element of the web page loaded on tablet 130. Server 120 receives the command over the network, which causes back end software running on the server to issue the associated commands to controller 100 through serial port 104. To reset, a user presses reset button 136 on web page 134. Pressing reset button 136 triggers http communication between tablet 130 and server 120. In response, a reset routine of the web server executable runs. The reset routine can be written in php, C, or any other suitable programming language, and is capable of communicating through serial cable 112 to controller 100. The reset routine can automatically put controller 100 into external control mode, issue the reset command, and then return to the read-only control mode of controller 100. Server 120 updates web page 134 to indicate the reset of turbomolecular pump 14 was completed successfully, or displays any error condition that persists after the reset attempt.

In other embodiments, tablet 130 runs an app or program that communicates with server 120 over the network, rather than using established web protocols to display a web page in a browser. The app communicates with server 120 by transmitting and receiving data packets through router 122.

Having a server 120 coupled to controller 100 that is operated by separate network-connected client devices, rather than using computer 110 directly connected to controller 100, increases the flexibility of the system. Any device connected to the same network can check status information of turbomolecular pump 14 and issue a reset command if desired. With laptop 110 in FIG. 2, only the laptop is connected to controller 100, and only the laptop can be used to access the controller. However, any networked device within semiconductor facility 10 can access server 120 to check on or reset turbomolecular pump 14. Engineers in clean room 20 can use tablets, laptops, phones, personal computers, or another suitable device to reset turbomolecular pump 14. Engineers sitting in cubicles or offices in other parts of the office complex can access server 120 through their desktop computers. Moreover, server 120 is accessible anywhere in the world by an engineer who connects to the Internet and uses a Virtual Private Network (VPN) to connect to router 122.

Server 120 is capable of connecting to a plurality of turbomolecular pump controllers, and showing information relating to each of the turbomolecular pumps on a single interface. The user can view information on, and reset, any of the turbomolecular pumps from one interface. Server 120 connected to controller 100 greatly increases convenience and flexibility for semiconductor manufacturing companies that have manufacturing equipment with turbomolecular pump generated vacuums.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor manufacturing system, comprising:
   a semiconductor manufacturing equipment disposed inside a room;
   a controller disposed outside the room and coupled to the semiconductor manufacturing equipment through a first cable, wherein the controller is configured to directly control operation of the semiconductor manufacturing equipment;
   a first computer disposed outside the room including a web server running on the first computer, wherein the first computer is configured to receive a first command via the web server and issue a second command to the controller in reaction to the first command to control the semiconductor manufacturing equipment, wherein the first computer is connected to the controller by a serial cable extending to a diagnostic port of the controller, and wherein the second command is configured to run a routine on the first computer that automatically puts the controller into an external control mode, issues a reset command to clear an error condition of the semiconductor manufacturing equipment, and then exits the external control mode; and
   a second computer disposed inside the room and connected to the web server of the first computer, wherein the second computer is configured to control the manufacturing equipment indirectly by issuing the first command to the web server.

2. The semiconductor manufacturing system of claim 1, wherein the second computer is coupled to the web server via an Ethernet or Wi-Fi connection.

3. The semiconductor manufacturing system of claim 1, wherein the semiconductor manufacturing equipment includes a turbine.

4. The semiconductor manufacturing system of claim 1, wherein the web server hosts a web page including a reset button on the web page configured to issue a reset command to the controller.

5. The semiconductor manufacturing system of claim 4, wherein the web page displays a status of the semiconductor manufacturing equipment.

6. A semiconductor manufacturing system, comprising:
   a semiconductor manufacturing equipment disposed in a first room;
   a controller disposed in a second room separate from the first room and coupled to control operation of the semiconductor manufacturing equipment;
   a web server configured to issue commands to the controller and display status information about the semiconductor manufacturing equipment on a web interface, wherein the status information includes whether an error condition exists for the semiconductor manufacturing equipment and an error code indicating what error occurred; and
   a computer disposed in the first room and configured to control the semiconductor manufacturing equipment by connecting to the web server and causing the web server to issue commands to the controller.

7. The semiconductor manufacturing system of claim 6, wherein:
   the web server is coupled to the controller via an RS-232 connection; and
   the controller is coupled to the semiconductor manufacturing equipment by a cable.

8. The semiconductor manufacturing system of claim 6, wherein the computer is coupled to the web server via an Ethernet or Wi-Fi connection.

9. The semiconductor manufacturing system of claim 6, wherein the controller is configured to directly control operation of the semiconductor manufacturing equipment.

10. The semiconductor manufacturing system of claim 6, wherein the web server hosts a web page including a reset button on the web page configured to issue a reset command to the controller.

11. The semiconductor manufacturing system of claim 10, wherein the web page displays a status of the semiconductor manufacturing equipment.

12. The semiconductor manufacturing system of claim 6, wherein the semiconductor manufacturing equipment includes a turbine directly controllable by the controller.

13. A method of semiconductor manufacturing, comprising:
   providing a semiconductor manufacturing equipment disposed in a first room;
   providing a controller disposed in a second room separate from the first room;
   coupling the controller to the semiconductor manufacturing equipment, wherein the controller is configured to control operation of the semiconductor manufacturing equipment;
   configuring a web server to issue commands to the controller;
   providing a computer in the first room and coupled to the web server via a network; and
   using the computer to control the semiconductor manufacturing equipment via the web server and controller, wherein a first command to the controller resets an error condition of the semiconductor manufacturing equipment, thereby automatically starting the semiconductor manufacturing equipment after an error condition previously stopped operation of the semiconductor manufacturing equipment.

14. The method of claim 13, further including using the web server to display a web page including a reset button on the web page configured to issue a reset command to the controller.

15. The method of claim 14, further including displaying a status of the semiconductor manufacturing equipment on the web page.

16. The method of claim 13, further including configuring the controller to directly control operation of the semiconductor manufacturing equipment.

17. The method of claim 13, wherein providing the semiconductor manufacturing equipment further includes providing a turbine directly controllable by the controller.

18. The method of claim 13, further including coupling the controller to the semiconductor manufacturing equipment with an RS-232 connection.

19. The method of claim 13, further including:
   placing the controller into an external control mode prior to the first command being issued; and
   removing the controller from the external control mode after the first command completes.

20. The method of claim 19, further including configuring the web server with a routine that automatically places the controller into the external control mode, issues the first command, and then removes the controller from the external control mode.

\* \* \* \* \*